United States Patent [19]

Jäntsch et al.

[11] 4,060,822
[45] Nov. 29, 1977

[54] STRIP TYPE RADIATION DETECTOR AND METHOD OF MAKING SAME

[75] Inventors: Ottomar Jäntsch; Ingmar Feigt, both of Erlangen; Wolf Rüdiger Willig, Erlangen-Bruck, all of Germany

[73] Assignee: Siemens Aktiengesellschaft, Munich, Germany

[21] Appl. No.: 660,756

[22] Filed: Feb. 24, 1976

Related U.S. Application Data

[62] Division of Ser. No. 374,019, June 27, 1973, Pat. No. 3,939,555.

[51] Int. Cl.² ............................................. H01L 27/14
[52] U.S. Cl. ......................................... 357/30; 357/55
[58] Field of Search ............................... 357/29, 30, 55

[56] References Cited

U.S. PATENT DOCUMENTS

| | | | |
|---|---|---|---|
| Re. 28,032 | 6/1974 | Scott | 250/211 J |
| 2,911,539 | 11/1959 | Tanenbaum | 250/211 |
| 3,278,337 | 10/1966 | Gault | 136/89 |
| 3,411,952 | 11/1968 | Ross | 136/89 |
| 3,493,822 | 2/1970 | Iles | 317/234 |
| 3,553,030 | 1/1971 | Lebrun | 136/89 |
| 3,575,721 | 4/1971 | Mann | 136/89 |

*Primary Examiner*—Martin H. Edlow
*Attorney, Agent, or Firm*—Kenyon & Kenyon, Reilly, Carr & Chapin

[57] ABSTRACT

An improved strip detector and a method for making such a detector in which a high resistivity N conduction semiconductor body has electrode strips formed thereon by diffusion which strips are formed so as to be covered by an oxide layer at the surface point of the PN junction and in which the opposite side of the semiconductor body then has a substantial amount of material etched away to form a thin semiconductor upon which strip electrodes which are perpendicular to the electrodes on the first side are then placed.

9 Claims, 6 Drawing Figures

STRIP TYPE RADIATION DETECTOR AND METHOD OF MAKING SAME

This is a division of application Ser. No. 374,019 filed June 27, 1973, now U.S. Pat. No. 3,939,555.

BACKGROUND OF THE INVENTION

This invention relates to strip detectors in general and more particularly to an improved strip detector and a method of making such a detector.

Strip detectors used for measuring ionizing radiation in which electrodes are disposed on both flat sides of a semi-conductor at angles to each other such that each intersection point forms a detector are presently known. For example, such detectors, which are also known as chess-board detectors, are disclosed in Swiss Pat. No. 460,962. The detector disclosed therein contains on a flat top side a large plurality of strip-like electrodes arranges parallel to each other and each of which is covered by a surface barrier layer. The electrodes comprise a vapor deposited gold layer which forms a schottky-type junction with the semi-conductor wafer on which it is deposited. On the opposite side of the semi-conductor wafer a plurality of strip-like electrodes of vapor deposited aluminum of a resistive nature and which are rotated with respect to the gold electrodes by a predetermined angle, preferably 90°, are provided. The semi-conductor wafer will generally consist of germanium or silicon. In this arrangement the intersection points of the electrodes on the two flat sides of the semi-conductor body make up a plurality of individual detectors for incident radiation. The arrangement is particularly useful as a detector for charged particles as well as a detector for gamma and x-rays and, in addition for light radiation which has an energy of more than approximately 1.1 electron volts. This arrangement provides a spacial resolution when measuring radiations of these types.

In U.S. Application Ser. No. 195,345 a detector arrangement of chess-board design and providing spacial resolution is shown in which gamma radiation measurements and provided as a visible output. The system operates similar to that of a conventional mosaic system with the photo multipliers normally used replaced by the intersection points of the strip electrodes which provide the individual detectors. Thus, rather than use a conventional florescent screen image intensifier, the semiconductor detector which, when struck by an electron beam, delivers corresponding electrical signals is used. From these signals the center of the electron beam is determined. At the same time the number of electrons can be recorded. Gamma quanta which has generated, at the input of the image intensifiers, a predetermined light distribution in a suitable detector system, for example, a curved single crystal are localized and their energy determined. Because the detector arrangement includes a large plurality of strip shaped contacts the point of incidence of the gamma quanta can be approximately determined in a digital form. The pulse height ratios of adjacent strips furnish in addition an analog correction signal. As applied in certain applications, these detectors of the prior art present problems. For example, if the strip detector is used as a localizing system for determining the center of gravity of the electron distribution of the image intensifier of a gamma camera it must be able to withstand, after installation in the image amplifier, high temperatures which can reach in excess of 300° C during a baking out process. To fulfill its purpose it must of course be able to withstand these temperatures without its electrical property being affected. Generally, the detectors of the prior art having vapor deposited electrodes require plastic parts, particularly araldite layers which will burn up at temperatures exceeding 150° making the detector useless. The barrier layers used with the vapor deposited gold electrons in addition are not suited for high temperatures because at these temperatures the metal will diffuse into the semi-conductor body and destroy the metal-semi-conductor junction which serves as the barrier layer.

In these prior art strip detectors, the aluminum strips are attached to an electrically insulating very thin, intermediate layer of silicone dioxide. The thickness of this layer generally does not exceed approximately 100 angstroms. Thus if the finished detector is treated at a temperature above 200° C, the aluminum can alloy itself through the thin silicon oxide layer and form a metal-semi-conductor contact with the semi-conductor body. If this occurs dE-dx operation is no longer possible.

An additional problem in the prior art detectors, which are also in some cases referred to as counters, is that charged particles or quanta entering the sensitive zone beneath an electrode are not always recorded by the corresponding intersection point on the other side of the semi-conductor, but instead are recorded by an adjacent intersection point. This phenomenon referred to as cross-talk results in a false measuring result.

Another surface boundry layer counter is disclosed in "Striped semi-conductor device 5441" published by A.B. Atomenergi Sect. S.S.I., Studicik Nykoping, Sweden. The detector disclosed therein contains an N conduction silicon semi-conductor body upon which parallel strip-like electrodes of gold with a thickness of about 250 angstroms and a width of about 0.8 mm are deposited. The electrodes are arranged parallel each other with a spacing of about 0.2 mm and each is provided with an electrode lead. Contamination present on the surface of these counters can generate through absorption, as inversion layer which forms a P induction channel between the electrode strips. This will result in cross-talk on the top side of the device. Although such cross-talk can be prevented, relatively complex means are required for that purpose. Such means are described in U.S. Pat. No. 3,624,399.

In addition to the problems noted above with prior art devices they are not capable of stable operation in a vacuum over extended periods of time. Thus it can be seen that there is a need for an improved device of this nature which can withstand high temperature, can operate in a vacuum and is not subject to high levels of cross-talk.

SUMMARY OF THE INVENTION

The present invention provides an improved strip detector for measuring the energy E of a radiation source and for also measuring the energy loss $dE/dx$ per unit of distance, which detector can operate under high temperatures in vacuums and does not have significant cross-talk. The semi-conductor used in the detector is an N conduction semi-conductor body with a resistivity of at least 100 ohm-cm. On the flat top of the semi-conductor P conduction electrode strips are formed by diffusion and are covered by an oxide layer. A portion of the semi-conductor body on the opposite flat side is then removed and this side then also provided with strip electrodes. Essentially the present invention recognizes that through the use of planar techniques the property of the detector device can be substantially improved and that through the use of a high resistivity semi-conductor material doping reversals under the oxide layer will not as a practical matter occur. The oxide layer forms a protection barrier for the cut-off electrode, the effectiveness of which does not change appreciably even at relatively high temperatures. By the etching of the semi-conductor body so that it is thin, cross-talk is prevented. In addition this arrangement permits operation in a vacuum over extended periods of time.

DETAILED DESCRIPTION OF THE PREFERRED EMBODIMENT

Figure 1:
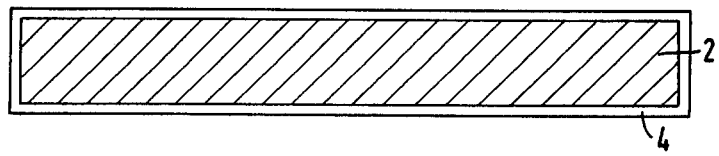
FIGS. 1 through 4 are cross-sectional elevation views illustrating the steps for making a first embodiment of a detector according to the present invention.
Figure 2:
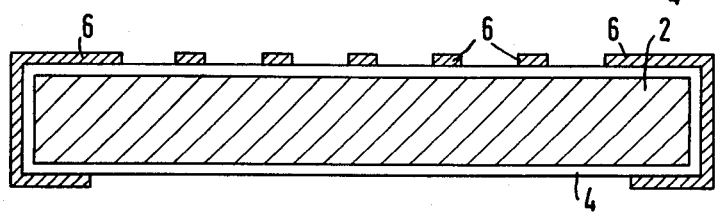
Figure 3:
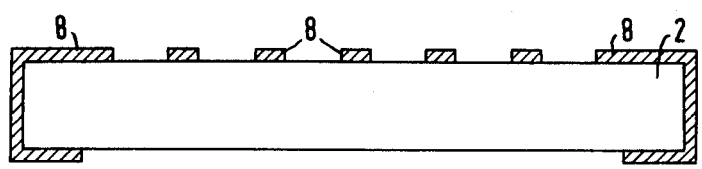

FIGS. 1 through 4 illustrate the process of making a detector according to the present invention. As shown in FIG. 1, a semi-conductor material having a high resistivity, preferably silicon is coated with an oxide layer 4. To accomplish this, the surface is first cleansed of the slight surface layer of crystal faults using chemical or mechanical removal techniques after which interfering external ions and contamination in addition to inorganic and also inorganic particles deposited on the surface are removed by a cleaning process. A particularly advantageous manner of forming the oxide layer is through the use of a gas stream preferably at elevated temperatures. Such a gas stream may be essentially oxygen or may also be oxygen mixed with inert gasses or nitrogen. Also another suitable mixture is that of water vapor and oxygen. Other well known oxidants such as carbon dioxide may also be used. The oxide layer, at least on the upper surface of the detector, is then covered with a layer of photo-sensitive varnish. THe varnish is then exposed using an appropriate mask and developed to provide a structure such as that shown on FIG. 2 wherein the layer 6 indicates the varnish layer. Such methods of photo-etching as this wherein the exposed parts become sensitive to a solvent and may then be washed off after exposure are well-known. As illustrated by FIG. 2, the type of mask used results in a plurality of parallel strips which are in a direction perpendicular to the paper. The semi-conductor is then subjected to an etching process which removes the oxide layer 4 from all portions of the semi-conductor body except those designated on FIG. 3 by the numeral 8, i.e., those which were covered by the varnish. After this etching process, the varnish is washed off leaving only the oxide layer 8 as shown on FIG. 3.

If desired, the portion of the oxide layer 4 on the flat bottom side as well as those on the two lateral surfaces of the semi-conductor 2 can also be covered with a material resistent to the etchent used. Such a material may, for example, be the material known by the name "picein". Thus, as shown on FIG. 3, these parts will also not have the oxide layer removed therefrom. In the spaces between the strips 8, doping material is diffused to form strip shaped electrodes 10 of P-conduction silicon. For use with the N conduction semi-conductor body 2 to form these P-conduction strips boron and also phosphorous may be used to diffuse into the semi-conductor to thereby form a plurality of PN junctions designated as 12 between the electrode areas 10 and the semi conductor body 2. The diffusion depth of the doping material and thereby the depth of the electrodes 10 will depend on the absorption properties of the radiation to be received. For example, if the detector arrangement is intended to be used for beta rays with an energy of 25 kev., the diffusion depth and the thickness of the sensitive layer of the detector should preferably be in the range of 0.1 to 1 micron. The best range for this purpose is about 0.3 micron. However, thickness of up to 5 microns are still useable. The minimum layer thickness should be at least 0.03 microns since thinner layers are difficult to produce. Note that where the PN junction meets the surface it is covered by the oxide layer 8. This protective layer over the junction is what prevents the aforementioned problems.

During the diffusion process a glass a layer 14 generated on the surface parts of the semi-conductor body in the spaces or windows between the strips 8 and over the detector strips 10. If, for example, phosphorous is used as the doping material, the layers 14 will comprise phosphor glass. These layers in general will have no adverse effect on the properties of the detector and can therefore remain, if desired, on the surface of the electrodes 10 as a protective layer. In general, the thickness of layer 14 will be substantially less than 0.1 microns. After this, the semi-conductor 2 is etched so that it is quite thin. To accomplish this, a waxed layer which acts as a protective layer [not shown on the Figure] is placed over the portions of the semi-conductor which are not to be etched. The etching process is then performed to remove a substantial portion of the bottom of the semi-conductor layer to thereby form a thin semi-conductor. After etching, a plurality of strip shaped electrodes 16 are then provided on the bottom flat side of the semi-conductor body 2 and placed thereon so as to form ohmic contact with the semi-conductor as shown on FIG. 4. Preferably these electrodes will comprise aluminum which is applied to the semi-conductor body 2 by means of vapor deposition and then subsequently alloyed. The electrodes 16 will be deposited in parallel relation to each other and at an angle with the electrodes 10 on the top layer. Preferably this angle will be 90°. In the embodiment shown, the electrodes 16 are extended around the side of the detector and up to the top flat side. This results in having all electrodes on the top side of the detector and makes interconnection simplier. To accomplish the bringing up of the electrodes to the top side, the portions 17 of the electrode may be formed in a common operation with formation of the electrodes 16, for example, through vapor deposition at an angle. The connecting section 18 may then be deposited on the flat top side. The spacing D between the electrodes 10 on the top side of the detector will preferably be kept small. Typically, this spacing should not exceed 100 micrometers and should preferably be less than 50 micrometers and even as small as 20 micrometers if possible. In conjunction with the small spacing of the top electrodes 10, an electrically conducting edge strip can be provided to advantage through the diffusion of doping material. This diffusion layer edge 26 will conduct the reverse current at the outer border and thereby form a guard ring which will limit the noise of the detector arrangement to a negligibly low value. Thus, the only remaining noise will be from the reverse volume current which is quite small.

Figure 4:
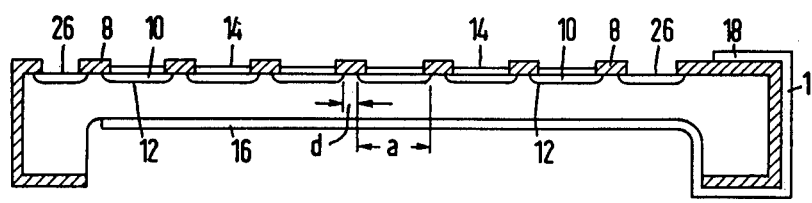
Figure 5:
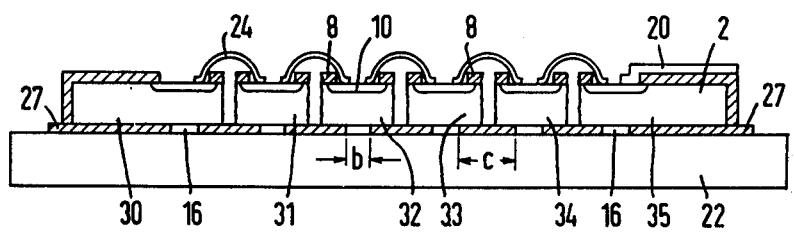
FIG. 5 is a cross section end view of the detector of FIG. 4.

FIG. 5 illustrates a cross sectional end view of a detector constructed generally as described above. In this view, the electrodes 10 of FIG. 4 are formed across the length of the detector with the bottom electrodes 16 running perpendicular into the paper. The illustrated embodiment shows how cross-talk may be substantially eliminated. The electrodes 10 on the upper side rather than forming a complete strip across the detector body are formed as substantially square PN junctions 10. The junctions across the detector are then connected by electrical conductors 24. Thus, as equivalent strip at 90° to the lower strips 16 is thereby formed. The semiconductor material between the junctions is scribed and the semi-conductor broken apart so that there is no path for cross-talk between the electrodes 10, through the semiconductor body. Since this affects the structural intergrity of the semi-conductor material, the detector is then placed on a substrate 22 which may, for example, be a suitably shaped ceramic body, preferably coated with a silicone varnish 27. Thus, the sections 30, 31, 32, 33, 34 and 35 of the semi-conductor which result from the scribing will rest on the substrate [actually on the varnish layer 27]. The connections 24 between the electrodes can be a thin aluminum conductor which is, for example, only 25 micrometers thick and which is attached to the electrodes 10 by ultrasonic welding.

To further reduce the cross-talk on the rear side of the detector, the width of the strip electrodes 16 designated by the dimension $b$ in FIG. 5 should be chosen substantially smaller than the width $a$ of the electrodes 10 as illustrated on FIG. 4. This causes mutual influence to be substantially reduced and de-coupling of the pre-amplifiers is obtained. The mutual spacing of the electrodes 16 on the rear side can be chosen, in conjunction with a predetermined resistivity of the semi-conductor material so that the resistance between strips is at least 5k ohm, and should if possible be at least 50k ohm.

Figure 6:
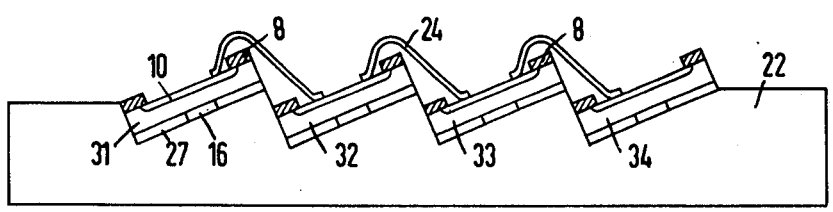
FIG. 6 illustrates a second embodiment of the detector of the present invention.

FIG. 6 illustrates a modification of the embodiment of FIG. 5. In this embodiment the ceramic body 22 is formed to have steps on which the semi-conductor body 2 or more particularly the portions thereof 31, 32, 33, and 34 rest. Each of the portions 31 through 34 has an electrode 16 on the bottom and an electrode 10 on the top side. As in the embodiment of FIG. 5, the strips are connected by conductors 24. The steps in the base plate 22 are of such a design so that the thickness of the base plate does not change from step to step. The portions 31 through 34 are placed on the steps such that their lateral surfaces do not abut. This results in a complete reduction of the possibility of short circuits between the individual strips 16.

Thus, an improved detector for detecting ionizing radiation has been shown. Although specific embodiments have been illustrated and described, it will be obvious to those skilled in the art that various modifications may be made without departing from the spirit of the invention which is intended to be limited solely by the claims.

What is claimed is:

1. A detector for ionizing radiation comprising:
    a. an N-conduction thin semi-conductor body having a resistivity of at least 100 ohm-cm and having two parallel flat sides;
    b. a plurality of diffused P conduction electrodes on one side of said semi-conductor in the form of parallel strips;
    c. an oxide layer covering the PN junctions on said one side; and
    d. a plurality of parallel metal electrodes in ohmic contact with the other side of said semi-conductor at an angle to the P conduction electrodes on said one side.
2. The invention according to claim 1 wherein said plurality of metal electrodes are each connected in an electrically conducting fashion with the border of said one side of said semi conductor.
3. The invention according to claim 2 and further including an electrically conducting guard ring of diffused-in doping material around said border.
4. The invention according to claim 2 wherein said semi conductor body is separated into individual parts along line between and parallel to said metal electrodes, wherein the portions of each of said P conduction strips thereby separated are electrically connected and further including a cermic body of insulating material to which said individual parts are attached.
5. The invention according to claim 4 wherein said ceramic body contains a plurality of inclined steps with each one of said individual parts attached to a different inclined step.
6. The invention according to claim 1 wherein said metal electrodes are arranged in a central region of the silicon semiconductor body which has been etched thin.
7. The invention according to claim 1 wherein said thin semiconductor body is considerably thicker at its outer edge than in the region of said electrodes.
8. The invention according to claim 1 wherein the width of said parallel metal electrodes is smaller than the width of said diffused P conduction electrodes.
9. The invention according to claim 1 wherein the width of said parallel metal electrodes is smaller than the spacing between adjacent ones of said plurality of parallel metal electrodes.

* * * * *